US012575296B2

(12) United States Patent
Zhou et al.

(10) Patent No.: US 12,575,296 B2
(45) Date of Patent: Mar. 10, 2026

(54) DISPLAY PANEL

(71) Applicant: Shenzhen China Star Optoelectronics Semiconductor Display Technology Co., Ltd., Guangdong (CN)

(72) Inventors: Libin Zhou, Guangdong (CN); Shijian Qin, Guangdong (CN); Xialiang Yuan, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 408 days.

(21) Appl. No.: 18/362,054

(22) Filed: Jul. 31, 2023

(65) Prior Publication Data

US 2024/0188381 A1 Jun. 6, 2024

(30) Foreign Application Priority Data

Dec. 2, 2022 (CN) .......................... 202211544772.2

(51) Int. Cl.
*H10K 59/82* (2023.01)
*H10K 50/16* (2023.01)
*H10K 59/122* (2023.01)
*H10K 59/80* (2023.01)

(52) U.S. Cl.
CPC ..... *H10K 59/80522* (2023.02); *H10K 50/166* (2023.02); *H10K 50/167* (2023.02); *H10K 59/122* (2023.02)

(58) Field of Classification Search
CPC ................................................. H10K 59/80522
USPC ..................................................... 313/498–512
See application file for complete search history.

(56) References Cited

U.S. PATENT DOCUMENTS

| | | | | |
|---|---|---|---|---|
| 2013/0328024 A1* | 12/2013 | Mizusaki | .............. | H05B 33/10 |
| | | | | 438/46 |
| 2018/0190944 A1* | 7/2018 | Lee | ...................... | H10K 59/126 |
| 2022/0209170 A1* | 6/2022 | Kang | ...................... | H10K 50/16 |
| 2024/0147756 A1* | 5/2024 | Tang | ................ | H10K 59/80522 |

* cited by examiner

*Primary Examiner* — Christopher M Raabe
(74) *Attorney, Agent, or Firm* — PV IP PC; Wei Te Chung

(57) ABSTRACT

The present application provides a display panel including: a substrate, a thin film transistor layer, an insulation layer, an anode layer, an electron transport layer, and a cathode layer. The thin film transistor layer includes an auxiliary transistor. A first cathode auxiliary hole is defined in the insulation layer. The anode layer includes a connection portion disposed in the first cathode auxiliary hole and electrically connected to the auxiliary transistor. The electron transport layer includes an electron transport portion disposed to correspond to the connection portion. The cathode layer includes a cathode auxiliary electrode connected to the electron transport portion. The present application can prevent an issue of uneven brightness due to voltage decrease and improves quality of the display panel.

20 Claims, 5 Drawing Sheets

DISPLAY PANEL

FIELD OF INVENTION

The present application relates to a field of display technologies, especially to a display panel.

BACKGROUND OF INVENTION

An organic light-emitting diode (OLED) is a current-type semiconductor light-emitting device that utilizes the injection and recombination of OLED carriers to excite organic materials and produce light for display. It is an active light-emitting device. Compared to passive light-emitting liquid crystal displays (LCDs), active light-emitting OLED displays offer advantages such as fast response times, high contrast, wide viewing angles, and the ability to achieve flexible displays.

However, OLEDs are highly sensitive to their driving current, and even slight fluctuations in current can affect their own light emission intensity. This sensitivity is particularly evident in large-sized OLED display panels, where the resistance of metal wirings is not zero at room temperature. The current flowing through the metal wirings leads to a certain voltage drop (IR Drop). As a result, the potential at different distances from the input end of the metal wirings varies, and due to this potential difference, the currents of OLEDs located at different positions in the display region differ. Consequently, uneven brightness occurs in the central area of large-sized display panels, which negatively impacts the display panel's visual quality.

SUMMARY OF INVENTION

The present application provides a display panel, and according to an issue of uneven display of the display panel due to voltage drop, provides a novel cathode auxiliary structure for providing a sufficient current that supports light emission of OLEDs.

The present application provides a display panel, comprising:

a substrate;

a thin film transistor layer disposed on the substrate and comprising an auxiliary transistor;

an insulation layer disposed on a side of the thin film transistor layer away from the substrate, wherein a first cathode auxiliary hole is defined in the insulation layer;

an anode layer disposed on a side of the insulation layer away from the substrate and comprising a connection portion disposed in the first cathode auxiliary hole and electrically connected to the auxiliary transistor;

an electron transport layer disposed on a side of the anode layer away from the substrate and comprising an electron transport portion disposed to correspond to the connection portion; and a cathode layer disposed on a side of the electron transport layer away from the substrate and comprising a cathode auxiliary electrode electrically connected to the electron transport portion.

In the display panel provided by the present application, the display panel further comprises a pixel definition layer disposed between the anode layer and the electron transport layer, a second cathode auxiliary hole is defined in the pixel definition layer, the second cathode auxiliary hole is defined to correspond to the first cathode auxiliary hole, and the electron transport portion is disposed in the second cathode auxiliary hole.

In the display panel provided by the present application, the connection portion comprises a first sub-electrode portion and a second sub-electrode portion; the first sub-electrode portion is connected to one of a source electrode and a drain electrode of the auxiliary transistor; the second sub-electrode portion is disposed circularly on a sidewall of the first cathode auxiliary hole and is connected to the first sub-electrode portion.

In the display panel provided by the present application, the second sub-electrode portion covers the sidewall of the first cathode auxiliary hole.

In the display panel provided by the present application, an end portion of a side of the connection portion away from the substrate is flush with the insulation layer.

In the display panel provided by the present application, the electron transport portion comprises a first sub-transport portion and a second sub-transport portion; the first sub-transport portion is disposed circularly in the first cathode auxiliary hole; the second sub-transport portion is disposed circularly in the second cathode auxiliary hole and is connected to the first sub-transport portion; and an orthographic projection of the connection portion on the substrate is within an orthographic projection of the electron transport portion on the substrate.

In the display panel provided by the present application, the electron transport portion covers the second cathode auxiliary hole.

In the display panel provided by the present application, the electron transport layer further comprises a third sub-transport portion disposed on a side of the pixel definition layer away from the substrate and connected to the electron transport portion.

In the display panel provided by the present application, the pixel definition layer further comprises a pixel definition portion disposed in the first cathode auxiliary hole and partially covering the connection portion.

In the display panel provided by the present application, an end portion of a side of the pixel definition portion away from the substrate is flush with an end portion of a side of the connection portion away from the substrate.

In the display panel provided by the present application, the end portion of the side of the pixel definition portion away from the substrate is flush with the insulation layer.

The display panel provided by the present application achieves improved display quality through the implementation of a novel cathode auxiliary structure. By configuring this structure, the connection portion can be conductively connected to the cathode auxiliary electrode before the display panel emits light. This arrangement allows for direct voltage current compensation to be provided to the cathode layer during the normal operation of the display panel, effectively preventing the occurrence of uneven brightness due to IR drop. As a result, the display quality is enhanced.

DETAILED DESCRIPTION OF PREFERRED EMBODIMENTS

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application.

Furthermore, the terms "first", "second", etc. in the description and claims of the present application and the above-mentioned drawings are used to distinguish different objects, not to describe a specific order. In addition, the terms "include" and "have" and any deformation of them is intended to cover non-exclusive inclusion. Because a source electrode and a drain electrode of a transistor adopted by the present application are symmetrical, the source electrode and the drain electrode are exchangeable.

Figure 1:
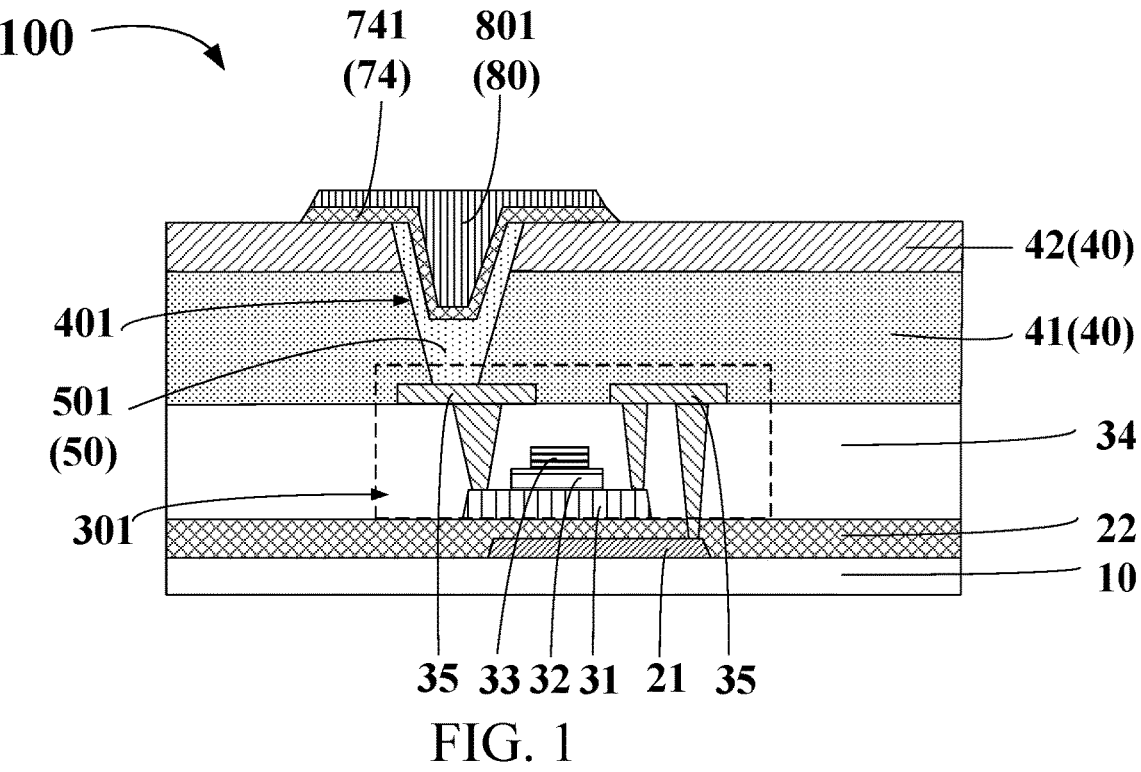
FIG. 1 is a first schematic structural view of a display panel provided by an embodiment of the present application.

With reference to FIG. 1, FIG. 1 is a first schematic structural view of a display panel provided by an embodiment of the present application. As shown in FIG. 1, the display panel 100 comprises: a substrate 10, a thin film transistor layer, a insulation layer 40, an anode layer 50, an electron transport layer 74, and a cathode layer 80.

In particular, the thin film transistor layer is disposed on the substrate 10, and the thin film transistor layer comprises an auxiliary transistor 301.

In particular, the insulation layer 40 is disposed on a side of the thin film transistor layer away from the substrate 10, and a first cathode auxiliary hole 401 is defined in the insulation layer 40.

In particular, the anode layer 50 is disposed on a side of the insulation layer 40 away from substrate, and the anode layer 50 comprises a connection portion 501. The connection portion 501 is disposed in the first cathode auxiliary hole 401, and the connection portion 501 is electrically connected to the auxiliary transistor 301. It should be noticed that the anode layer 50 comprises an anode portion, the anode portion is spaced insulatively from the connection portion 501. A light emitting functional layer of a pixel is disposed on a side of the anode portion away from the substrate 10. Because the anode portion is a conventional technology, no repeated description is here.

In particular, the electron transport layer 74 is disposed on a side of the anode layer 50 away from the substrate 10, the electron transport layer 74 comprises an electron transport portion 741, and the electron transport portion 741 is disposed to correspond to the connection portion 501.

In particular, the cathode layer 80 is disposed on a side of the electron transport layer 74 away from the substrate 10, and the cathode layer 80 comprises a cathode auxiliary electrode 801, and the cathode auxiliary electrode 801 is electrically connected to the electron transport portion 741.

In the display panel 100 provided by the present embodiment, the connection portion 501 of the anode layer 50 is disposed in the first cathode auxiliary hole 401. Then, the electron transport portion 741 of the electron transport layer 74 is disposed to correspond to the connection portion 501 such that the electron transport portion 741 is disposed on a side of the connection portion 501 away from the substrate 10. Then, the cathode auxiliary electrode 801 of the cathode layer 80 is connected to the electron transport portion 741.

Namely, in the display panel 100 provided by the present embodiment, the electron transport portion 741 spaces the connection portion 501 from the cathode auxiliary electrode 801 such that before the display panel 100 emits light, through the auxiliary transistor 301, a first voltage can be applied to the connection portion 501, and simultaneously, a second voltage having an electrical potential less than that of the first voltage is applied to the cathode auxiliary electrode 801. In particular, through the auxiliary transistor 301, a positive voltage can be applied to the connection portion 501, and simultaneously a negative voltage can be applied to the cathode auxiliary electrode 801 to generate a potential difference between the connection portion 501 and the cathode auxiliary electrode 801 such that the electron transport portion 741 is struck through and under the effect of the electrical field and becomes conductive to achieve electric conduction between the connection portion 501 and the cathode auxiliary electrode 801. Furthermore, when the display panel 100 works normally, the cathode layer 80 can be provided with voltage current compensation through the connection portion 501 to prevent voltage drop from occurring in a large area of the display panel and resulting in an issue of uneven brightness to improve display quality.

The substrate 10 can adopt a transparent and insulative substrate such as glass substrate, silicon substrate, and plastic substrate with excellent heat resistance capability.

The thin film transistor layer comprises an active layer 31, a gate electrode insulation layer 32, a gate electrode layer 33, an interlayer dielectric layer 34, and a source and drain electrode metal layer 35 disposed sequentially. The thin film transistor layer comprises a plurality of thin film transistors (abbreviated as TFT) and signal wiring. The TFTs at least comprise oxide semiconductor TFTs, and can further comprise one or more of low-temperature polycrystalline silicon TFTs and amorphous silicon TFTs. The TFTs at least comprise TFTs of a top gate-type structure, and can further comprise TFTs of a bottom gate-type structure. In the present embodiment, for convenient and intuitive explanation, the auxiliary transistor 301 shown in FIG. 1 is TFT of a top gate-type structure. In some embodiments, the auxiliary transistor 301 can also be a TFT of a bottom gate-type structure as long as the connection portion 501 can be electrically connected to the auxiliary transistor 301.

The insulation layer 40 is configured to insulatively protect the thin film transistor layer. Therefore, the insulation layer 40 can comprise a passivation layer 41 and a planarization layer 42. The passivation layer 41 is disposed on a side of the thin film transistor layer away from the substrate 10. The passivation layer 41 performs an insulation protective function for the thin film transistor layer. The passivation layer 41 can adopt silicon oxide film material. The planarization layer 42 is disposed on a side of the passivation layer 41 away from the substrate 10, and the planarization layer 42 is configured to guarantee flatness of the anode layer 50 and eliminate step difference. Of course, in some embodiments, a step difference between film layers is not obvious, and the insulation layer 40 can only comprise the passivation layer 41 without disposing the planarization layer 42 to guarantee flatness of the anode layer 50.

The anode layer 50 adopts material comprising metal oxide and metal. For example, the anode layer 50 can comprise metal oxide material, metal material, and metal oxide material laminated sequentially. In particular, the anode layer 50 can comprise indium tin oxide, metal silver, and indium tin oxide material (ITO/Ag/ITO) laminated sequentially. The anode layer 50 can comprise indium zinc oxide, metal silver, and indium zinc oxide material (IZO/Ag/IZO) laminated sequentially.

By the auxiliary transistor 301, a first voltage is applied to the connection portion 501, and also, a second voltage is applied to the cathode auxiliary electrode 801, a potential difference formed between the connection portion 501 and the cathode auxiliary electrode 801 drives silver ions in the connection portion 501 migrate and penetrate the electron transport portion 741 to achieve conduction, which conveniently provides a sufficient current to support the cathode and guarantees display uniformity of the display panel 100.

Figure 2:
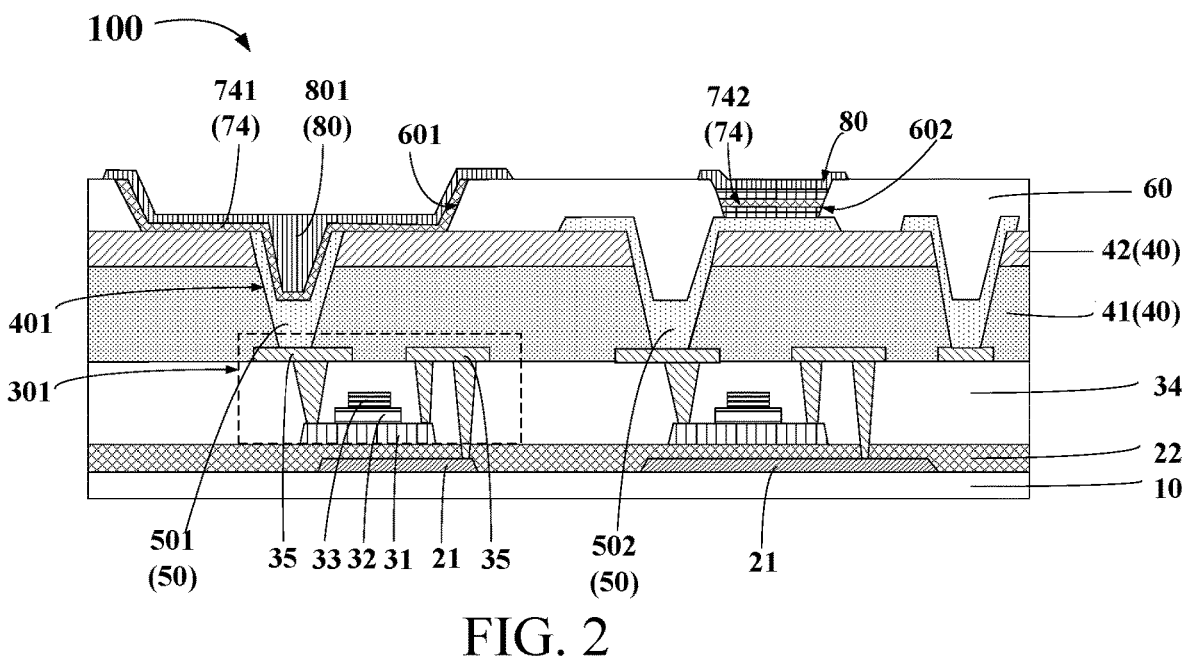
FIG. 2 is a second schematic structural view of the display panel provided by the embodiment of the present application.

In some embodiments, With reference to FIG. 2, FIG. 2 is a second schematic structural view of the display panel provided by the embodiment of the present application. As shown in FIG. 2, a difference from the display panel provided by the previous embodiment is that: The display panel 100 provided by the present embodiment further comprises a pixel definition layer 60, the pixel definition layer 60 is disposed between the anode layer 50 and the electron transport layer.

The pixel definition layer 60 is configured to define a second cathode auxiliary hole 601 and a pixel region 602 to dispose the light emitting functional layer in the pixel region 602 defined by the pixel definition layer 60 to dispose the second cathode auxiliary hole 601 to correspond to the first cathode auxiliary hole 401 to dispose the electron transport portion 741 in the second cathode auxiliary hole 601 such that the electron transport portion 741 is disposed on a side of the connection portion 501 away from the substrate 10. Therefore, through the auxiliary transistor 301, the first voltage can be applied to the connection portion 501, simultaneously the second voltage can be applied to the cathode auxiliary electrode, and an electrical potential of the second voltage is less than an electrical potential of the first voltage such that the electron transport portion 741 is struck through and under the effect of the electrical field and becomes conductive to achieve electric conduction between the connection portion 501 and the cathode auxiliary electrode 801.

It should be noticed that In the display panel 100 provided by the present embodiment, the anode layer 50 further comprises an anode portion 502. The anode portion 502 is spaced insulatively from the connection portion 501 such that the light emitting functional layer of the pixel is disposed on a side of the anode portion away from the substrate 10. Because the anode portion is a conventional technology, no repeated description is here.

Remarkably, with further reference to FIG. 2, in the thin film transistor layer, a driver transistor correspondingly connected to the anode portion 502 is disposed, and an auxiliary transistor 301 correspondingly connected to the connection portion 501 is disposed. Thus, a sufficient current is supplied to the cathode auxiliary electrode 801 through the auxiliary transistor 301, and the pixel is driven by the driver transistor to emit light.

Material of the pixel definition layer 60 can be hydrophobic material for guaranteeing flatness of the light emitting functional layer when a ink-jet print (IJP) technology is applied to form a light emitting functional layer in the pixel region 602.

The light emitting functional layer comprises a hole injection layer, a hole transport layer, a light emitting material layer, a pixel electron transport portion 742, and an electron injection layer laminated sequentially. Therefore, the entire cathode layer 80 is disposed on a side of the electron injection layer away from the substrate 10.

With further reference to FIGS. 1 and 2, in some embodiments, the display panel 100 further comprises a light shielding layer 21 and a buffer layer 22.

The light shielding layer 21 is disposed on the substrate 10 an is configured to prevent the active layer 31 in the thin film transistor layer from influence from light irradiation. Optionally, material of the light shielding layer 21 is selected from one of copper (Cu), tantalum (Ta), tungsten (W), molybdenum (Mo), aluminum (Al), titanium (Ti), copper niobium (CuNb) alloy, a lamination layer of copper (Cu) and molybdenum (Mo), a lamination layer of copper (Cu) and molybdenum titanium (MoTi) alloy, a lamination layer of copper (Cu) and titanium (Ti), a lamination layer of aluminum (Al) and molybdenum (Mo), a lamination layer of molybdenum (Mo) and tantalum (Ta), a lamination layer of molybdenum (Mo) and tungsten (W), and a lamination layer of molybdenum (Mo)-aluminum (Al)-molybdenum (Mo). Optionally, the light shielding layer 21 can comprise a light shielding metal layer, a diffusion barrier layer, and an etching barrier layer laminated sequentially. Material of the light shielding metal layer can be a lamination layer of Mo/Cu. Material of the diffusion barrier layer can be material such as MoTi, Mo, Ta, etc. including a work function similar to that of Cu. Material of the etching barrier layer can be metal oxide such as ITO, iGZO, etc.

The buffer layer 22 is disposed on a side of the light shielding layer 21 away from the substrate 10. the buffer layer 22 is configured to prevent metal of the light shielding layer 21 from entering the active layer 31 in the thin film transistor layer. Material of the buffer layer 22 is selected from one or more of oxidized silicon, nitric oxide, silicon nitride, and oxidized silicon, nitric oxide, and silicon nitride. Also, the buffer layer 22 performs a buffer and protection function to the thin film transistor layer.

In the present embodiment, based on the light shielding layer 21, a positive voltage can be applied to a light shielding portion of the light shielding layer 21 corresponding to the auxiliary transistor 301 to drive the auxiliary transistor 301 to a switch-on state to provide the positive voltage to the connection portion 501 electrically connected to the auxiliary transistor 301, and simultaneously, a negative voltage is applied to the cathode auxiliary electrode 801 to generate a potential difference between the connection portion 501 and the cathode auxiliary electrode 801 such that the electron transport portion 741 is struck through and under the effect of the electrical field and becomes conductive to achieve electric conduction between the connection portion 501 and the cathode auxiliary electrode 801.

In some embodiments, with further reference to FIG. 1, as shown in FIG. 1, in the display panel 100 provided by the present embodiment, the electron transport portion 741 is formed integrally, and the electron transport portion 741 covers the second cathode auxiliary hole 601.

Figure 3:
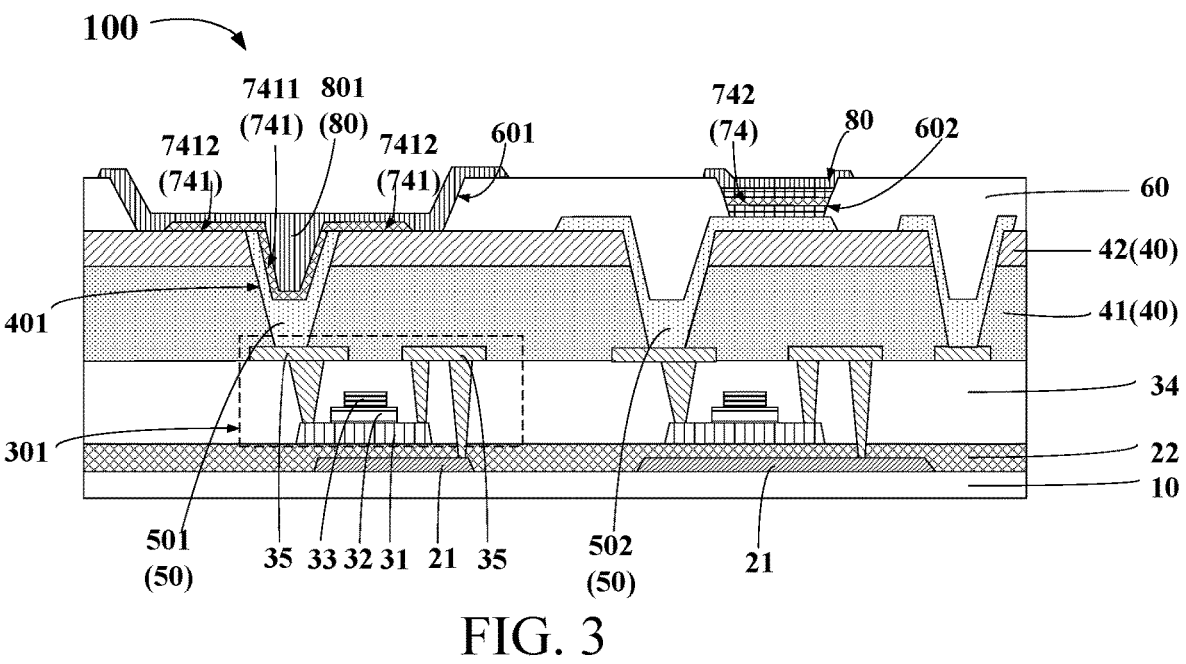
FIG. 3 is a third schematic structural view of the display panel provided by the embodiment of the present application.

In some embodiments, with further reference to FIG. 3, FIG. 3 is a third schematic structural view of the display panel provided by the embodiment of the present application. As shown in FIG. 3, the electron transport portion 741 of the display panel 100 comprises a first sub-transport portion 7411 and a second sub-transport portion 7412. The first sub-transport portion 7411 is disposed circularly in the first cathode auxiliary hole 401, the second sub-transport portion 7412 is disposed circularly in the second cathode auxiliary hole 601, and an orthographic projection of the connection portion 501 on the substrate 10 is within in a range of an orthographic projection of the electron transport portion 741 on the substrate 10.

In the present embodiment, disposing the first sub-transport portion 7411 in the first cathode auxiliary hole 401 prevents the cathode auxiliary electrode 801 from directly contacting the connection portion 501 in the first cathode auxiliary hole 401. Disposing the second sub-transport portion 7412 in the second cathode auxiliary hole 601 prevents the cathode auxiliary electrode 801 directly contacting the connection portion 501 in the second cathode auxiliary hole 601. Namely, the first sub-transport portion 7411 and the second sub-transport portion 7412 commonly prevent direct contact of the cathode auxiliary electrode 801 resulting in short circuit of the auxiliary transistor 301, which ensures a condition of forming a potential difference between the connection portion 501 and the cathode auxiliary electrode 801, to guarantee that the electron transport portion 741 is struck through and under the effect of the electrical field and becomes conductive to achieve electric conduction between the connection portion 501 and the cathode auxiliary electrode 801.

Figure 4:
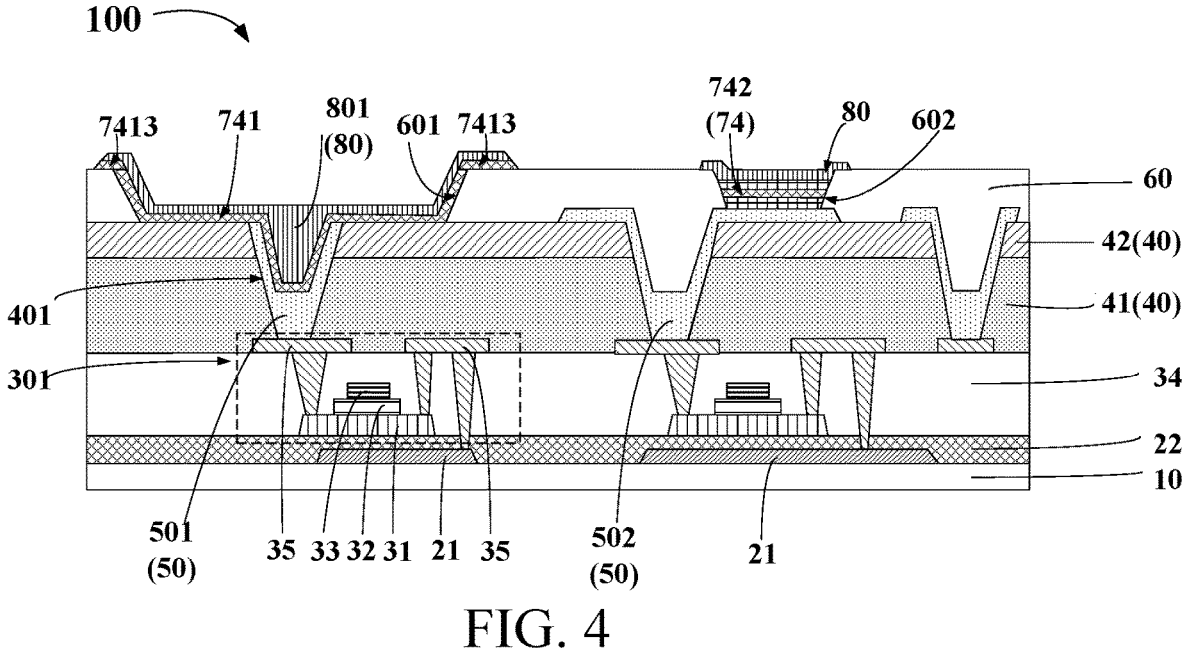
FIG. 4 is a fourth schematic structural view of the display panel provided by the embodiment of the present application.

With reference to FIG. 4, FIG. 4 is a fourth schematic structural view of the display panel provided by the embodiment of the present application. As shown in FIG. 4, a difference of the present embodiment from the previous embodiment is that: In the present the display panel 100, the electron transport layer 74 further comprises a third sub-transport portion 7413. The third sub-transport portion 7413 is disposed on a side of the pixel definition layer 60 away from the substrate 10, and the third sub-transport portion 7413 is connected to the electron transport portion 741.

In the present embodiment, disposing the third sub-transport portion 7413 outside the second cathode auxiliary hole 601 is equivalent to increasing a contact area between the electron transport portion 741 and the cathode auxiliary electrode 801 and advantages a time that the electron transport portion 741 under the effect of the electrical field is struck through and becomes conductive.

Figure 5:
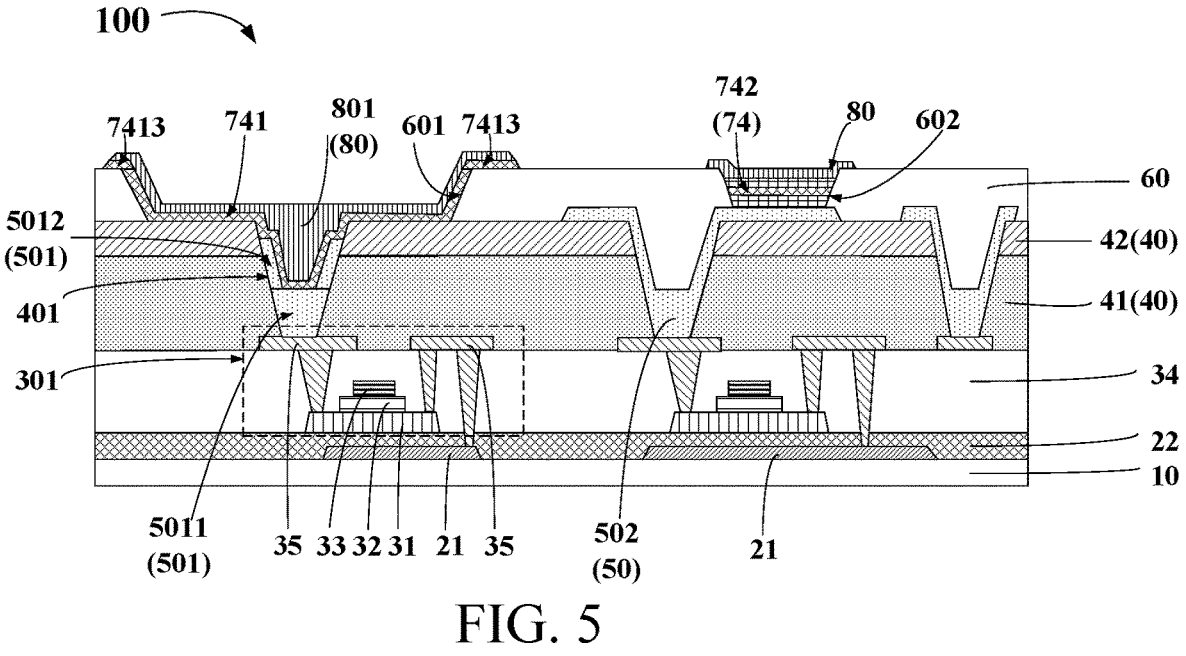
FIG. 5 is a fifth schematic structural view of the display panel provided by the embodiment of the present application.

With reference to FIG. 5, FIG. 5 is a fifth schematic structural view of the display panel provided by the embodiment of the present application. As shown in FIG. 5, a difference of the present embodiment from the previous embodiment is that: In the present the display panel 100, the connection portion 501 comprises a first sub-electrode portion 5011 and a second sub-electrode portion 5012.

The first sub-electrode portion 5011 is connected to one of a source electrode or a drain electrode of the auxiliary transistor 301. The second sub-electrode portion 5012 is disposed circularly on a sidewall of the first cathode auxiliary hole 401 and is connected to the first sub-electrode portion 5011.

In the present embodiment, the first sub-electrode portion 5011 is disposed on a side of a source electrode or a drain electrode of the auxiliary transistor 301 away from the substrate 10 such that electrical connection of the auxiliary transistor 301 and the connection portion 501 is achieved through the first sub-electrode portion 5011. Disposing the second sub-electrode portion 5012 circularly on the sidewall of the first cathode auxiliary hole 401 and connecting the first sub-electrode portion 5011 with the second sub-electrode portion 5012 guarantees a certain contact area between the first sub-electrode portion 5011 and the electron transport portion 741 and a certain contact area between the second sub-electrode portion 5012 and the electron transport portion 741 to increase a contact area between the connection portion 501 and the electron transport portion 741, which advantages shorting a time that the electron transport portion 741 under the effect of the electrical field is struck through and becomes conductive.

Figure 6:
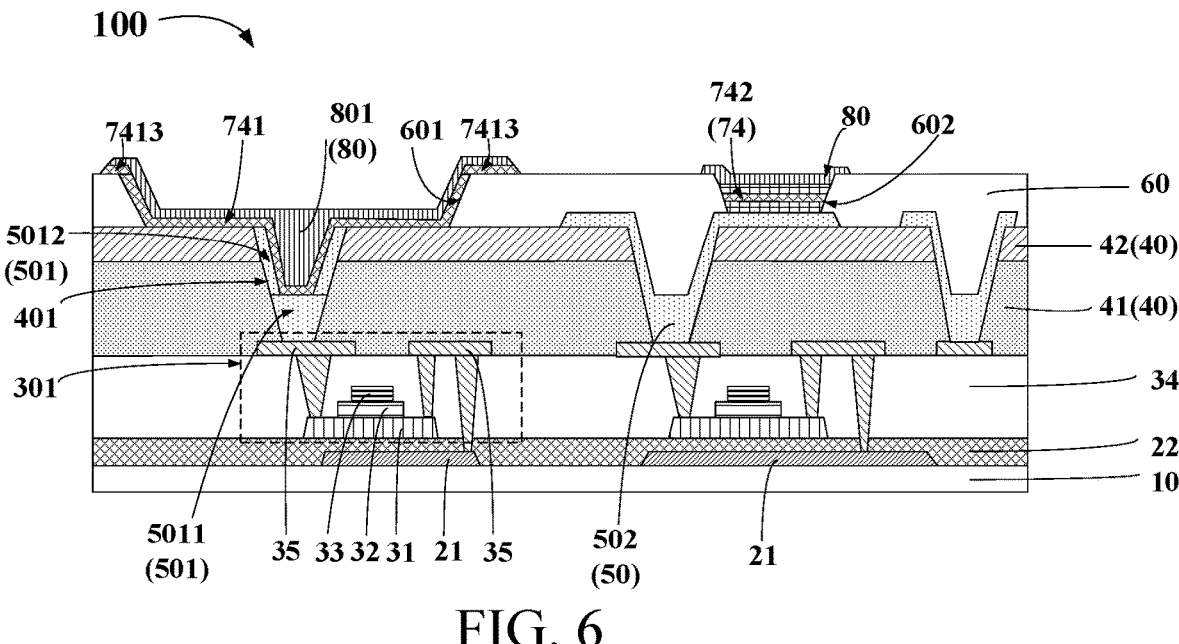
FIG. 6 is a sixth schematic structural view of the display panel provided by the embodiment of the present application.

With reference to FIG. 6, FIG. 6 is a sixth schematic structural view of the display panel provided by the embodiment of the present application. As shown in FIG. 6, a difference of the present embodiment from the previous embodiment is that: In the present the display panel 100, the second sub-electrode portion 5012 covers the sidewall of the first cathode auxiliary hole 401.

In the present embodiment, in a prerequisite of the connection portion 501 disposed in the first cathode auxiliary hole 401, the second sub-electrode portion 5012 covering the sidewall of the first cathode auxiliary hole 401 and maximizing a contact area between the connection portion 501 and the electron transport portion 741 advantages shorting a time that the electron transport portion 741 is struck through under the effect of the electrical field and becomes conductive.

Figure 7:
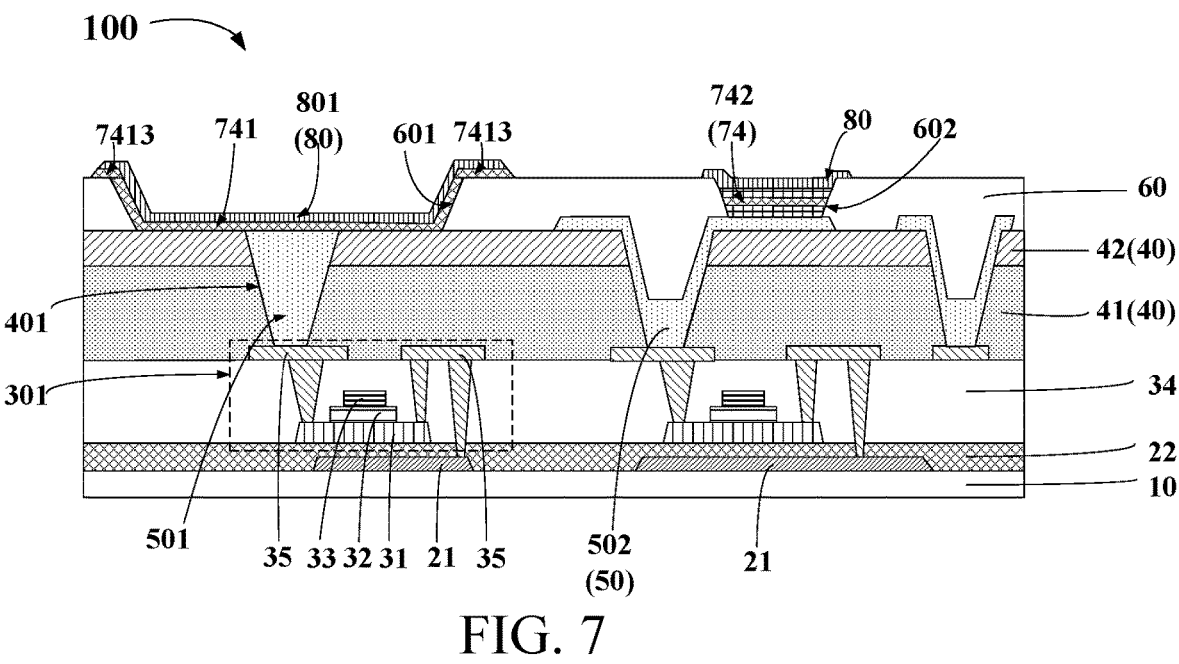
FIG. 7 is a seventh schematic structural view of the display panel provided by the embodiment of the present application.

With reference to FIG. 7, FIG. 7 is a seventh schematic structural view of the display panel provided by the embodiment of the present application. As shown in FIG. 7, a difference of the present embodiment from the previous embodiment is that: In the present display panel 100, an end portion of a side of the connection portion 501 away from the substrate 10 is flush with the insulation layer 40.

The purpose for disposing the connection portion 501 in such way is to make the first cathode auxiliary hole 401 filled with the connection portion 501 completely. Accordingly, the electron transport portion 741 can only be disposed the second cathode auxiliary hole 601 for preventing the cathode auxiliary electrode 801 from directly contacting the connection portion 501.

Figure 8:
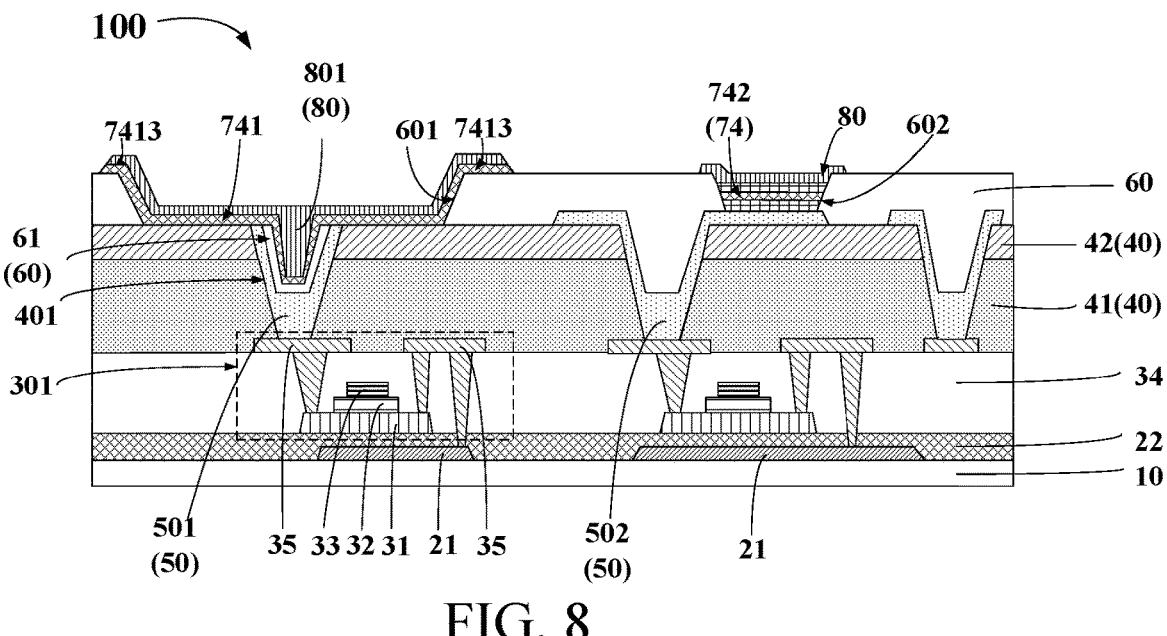
FIG. 8 is an eighth schematic structural view of the display panel provided by the embodiment of the present application.

With reference to FIG. 8, FIG. 8 is an eighth schematic structural view of the display panel provided by the embodiment of the present application. As shown in FIG. 8, a difference of the present embodiment from the previous embodiment is that: In the present the display panel 100, the pixel definition layer 60 further comprises a pixel definition portion 61.

The pixel definition portion 61 is disposed in the first cathode auxiliary hole 401 such that the pixel definition portion 61 is disposed on a side of the connection portion 501 away from the substrate 10.

During a process of manufacturing the display panel 100, a first cathode auxiliary hole 401 is defined in the insulation layer 40 first; then, an anode layer 50 in form of an entire surface is deposited, and the anode layer 50 is patterned to form a connection portion in the first cathode auxiliary hole 401; then, a pixel definition layer 60 in form of an entire surface is deposited to make the pixel definition layer 60 cover the insulation layer 40 and the anode layer 50, and under such circumstance, the first cathode auxiliary hole 401 is also filled with the pixel definition layer 60; then, in the pixel definition layer 60, a second cathode auxiliary hole 601 is defined in a region corresponding to the first cathode auxiliary hole 401 such that the connection portion 501 can be exposed at least through the second cathode auxiliary hole 601 for later connection of the electron transport portion 741 with the connection portion 501 to achieve connection of the connection portion 501 with the electron transport portion 741 and connection of the electron transport portion 741 with the cathode auxiliary electrode 801 to form a condition required for the electron transport portion 741 under the effect of the electrical field being struck through and becoming conductive.

Therefore, during formation of the second cathode auxiliary hole 601, the pixel definition portion 61 in the first cathode auxiliary hole 401 can be etched partially, as long as it is guaranteed that connection of the connection portion 501 with the electron transport portion 741 is achieved without the connection portion 501 completely covered by the pixel definition portion 61. Therefore, a time for etching the pixel definition layer 60 can be saved to reduce product costs.

Figure 9:
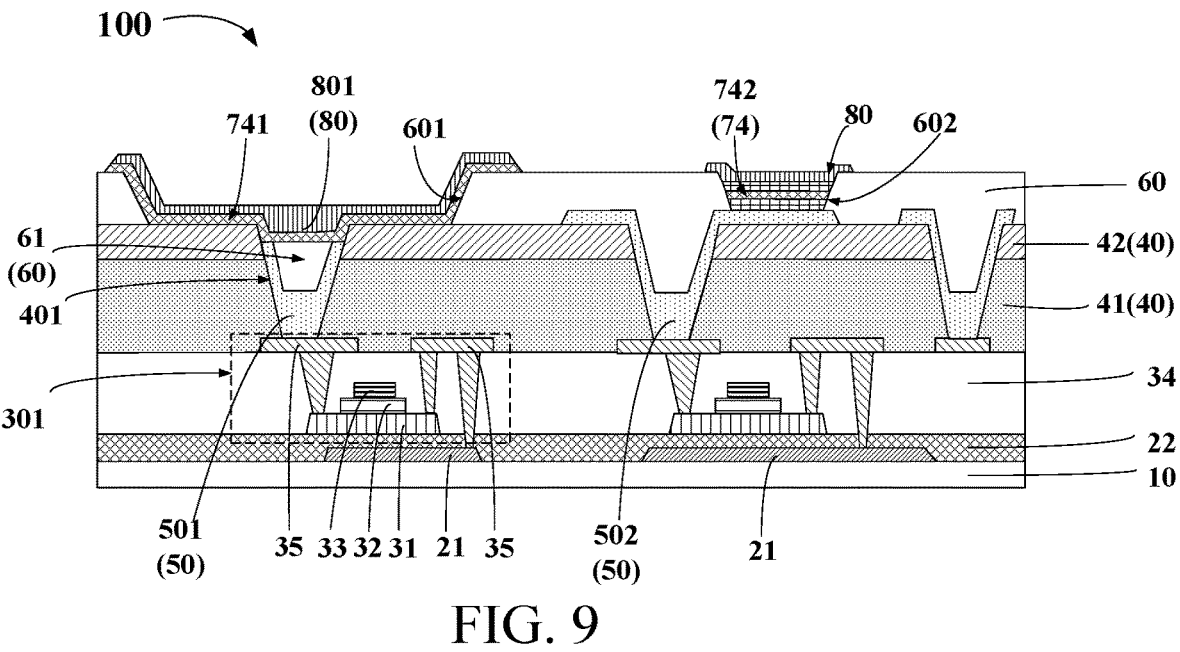
FIG. 9 is a ninth schematic structural view of the display panel provided by the embodiment of the present application.

With reference to FIG. 9, FIG. 9 is a ninth schematic structural view of the display panel provided by the embodiment of the present application. As shown in FIG. 9, a difference of the present embodiment from the previous embodiment is that: In the present the display panel 100, an end portion of a side of the pixel definition portion 61 away from the substrate 10 is flush with an end portion of a side of the connection portion 501 away from the substrate 10.

The purpose of setting up the display panel 100 as described in the present embodiment is to avoid the need for completely etching of the pixel definition layer 60 located on one side of the connection portion 501 away from the substrate 10. It is only necessary to allow the end portion of the connection portion 501, which is away from the substrate 10, to directly connect with the electron transport portion 741. This further reduces the time required for etching the pixel definition layer 60 and, consequently, lowers production costs.

Figure 10:
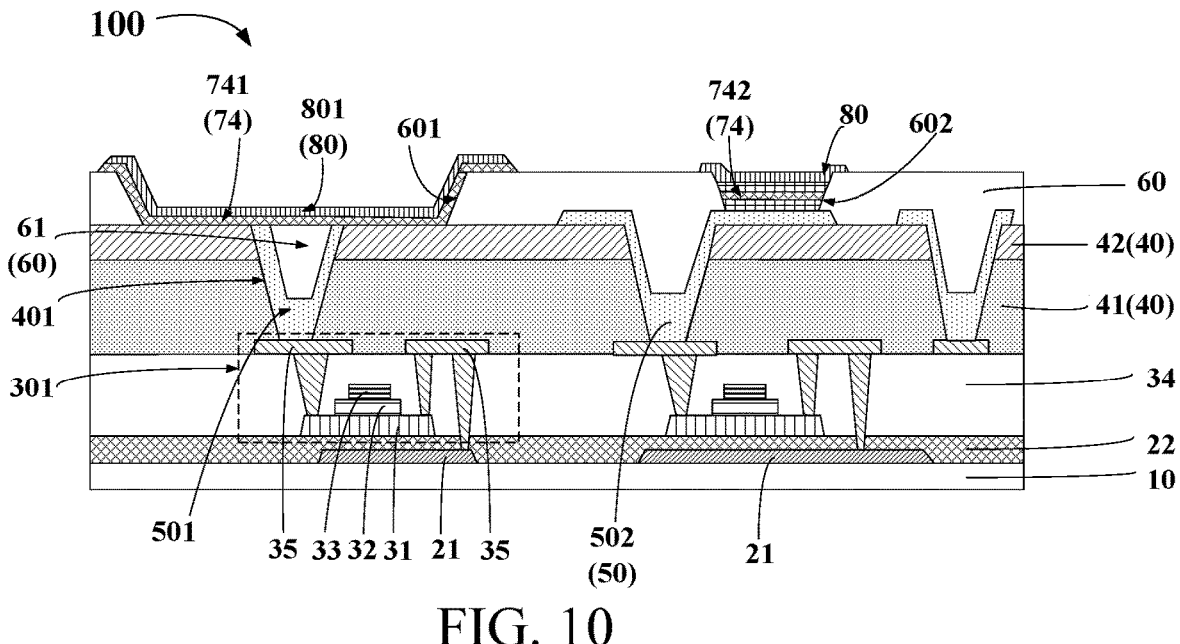
FIG. 10 is a tenth schematic structural view of the display panel provided by the embodiment of the present application.

With reference to FIG. 10, FIG. 10 is a tenth schematic structural view of the display panel provided by the embodiment of the present application. As shown in FIG. 10, a difference of the present embodiment from the previous embodiment is that: In the present the display panel 100, the end portion of the side of the pixel definition portion 61 away from the substrate 10 is further flush with the insulation layer 40.

Namely, in the display panel 100 provided by the present embodiment, the end portion of the side of the pixel definition portion 61 away from the substrate 10 is flush with the end portion of the side of the connection portion 501 away from the substrate 10, and the end portion of the side of the pixel definition portion 61 away from the substrate 10 is further flush with the insulation layer 40.

Namely, based on that the connection portion 501 can just cover the sidewall of the first cathode auxiliary hole 401 to form the second cathode auxiliary hole 601 in the pixel definition layer 60, an end portion of a side of the connection portion 501 away from the substrate 10 is therefore exposed such that direct connection of the connection portion 501 with the electron transport portion 741 can be achieved without need for etching the pixel definition portion 61 in the first cathode auxiliary hole 401, which further shortens the time for etching the pixel definition layer 60 and further lower production costs.

The above is merely an embodiment of the present application and does not limit the scope of the patent. Any equivalent structures or equivalent process variations made using the content of this application and its drawings, or directly or indirectly applied in other related technical fields, shall also be included within the scope of patent protection of this application.

What is claimed is:

1. A display panel, comprising:
a substrate;
a thin film transistor layer disposed on the substrate and comprising an auxiliary transistor;
an insulation layer disposed on a side of the thin film transistor layer away from the substrate, wherein a first cathode auxiliary hole is defined in the insulation layer;
an anode layer disposed on a side of the insulation layer away from the substrate and comprising a connection portion disposed in the first cathode auxiliary hole and electrically connected to the auxiliary transistor;
an electron transport layer disposed on a side of the anode layer away from the substrate and comprising an electron transport portion disposed to correspond to the connection portion; and
a cathode layer disposed on a side of the electron transport layer away from the substrate and comprising a cathode auxiliary electrode electrically connected to the electron transport portion.

2. The display panel according to claim 1, wherein the display panel further comprises a pixel definition layer disposed between the anode layer and the electron transport layer, a second cathode auxiliary hole is defined in the pixel definition layer, the second cathode auxiliary hole is defined to correspond to the first cathode auxiliary hole, and the electron transport portion is disposed in the second cathode auxiliary hole.

3. The display panel according to claim 1, wherein the connection portion comprises a first sub-electrode portion and a second sub-electrode portion;
the first sub-electrode portion is connected to one of a source electrode and a drain electrode of the auxiliary transistor;
the second sub-electrode portion is disposed circularly on a sidewall of the first cathode auxiliary hole and is connected to the first sub-electrode portion.

4. The display panel according to claim 3, wherein the second sub-electrode portion covers the sidewall of the first cathode auxiliary hole.

5. The display panel according to claim 1, wherein an end portion of a side of the connection portion away from the substrate is flush with the insulation layer.

6. The display panel according to claim 2, wherein the electron transport portion comprises a first sub-transport portion and a second sub-transport portion;
the first sub-transport portion is disposed circularly in the first cathode auxiliary hole;
the second sub-transport portion is disposed circularly in the second cathode auxiliary hole and is connected to the first sub-transport portion; and
an orthographic projection of the connection portion on the substrate is within an orthographic projection of the electron transport portion on the substrate.

7. The display panel according to claim 2, wherein the electron transport portion covers the second cathode auxiliary hole.

8. The display panel according to claim 7, wherein the electron transport layer further comprises a third sub-transport portion disposed on a side of the pixel definition layer away from the substrate and connected to the electron transport portion.

9. The display panel according to claim 1, wherein the pixel definition layer further comprises a pixel definition portion disposed in the first cathode auxiliary hole and partially covering the connection portion.

10. The display panel according to claim 9, wherein an end portion of a side of the pixel definition portion away from the substrate is flush with an end portion of a side of the connection portion away from the substrate.

11. The display panel according to claim 10, wherein the end portion of the side of the pixel definition portion away from the substrate is flush with the insulation layer.

12. A display panel, comprising:

a substrate;

a thin film transistor layer disposed on the substrate and comprising an auxiliary transistor;

an insulation layer disposed on a side of the thin film transistor layer away from the substrate, wherein a first cathode auxiliary hole is defined in the insulation layer;

an anode layer disposed on a side of the insulation layer away from the substrate and comprising a connection portion disposed in the first cathode auxiliary hole and electrically connected to the auxiliary transistor;

an electron transport layer disposed on a side of the anode layer away from the substrate and comprising an electron transport portion disposed to correspond to the connection portion; and a cathode layer disposed on a side of the electron transport layer away from the substrate and comprising a cathode auxiliary electrode electrically connected to the electron transport portion;

wherein the display panel further comprises a pixel definition layer disposed between the anode layer and the electron transport layer, a second cathode auxiliary hole is defined in the pixel definition layer, the second cathode auxiliary hole is defined to correspond to the first cathode auxiliary hole, and the electron transport portion is disposed in the second cathode auxiliary hole;

wherein the connection portion comprises a first sub-electrode portion and a second sub-electrode portion, the first sub-electrode portion is connected to one of a source electrode and a drain electrode of the auxiliary transistor, and the second sub-electrode portion is disposed circularly on a sidewall of the first cathode auxiliary hole and is connected to the first sub-electrode portion.

13. The display panel according to claim 12, wherein the second sub-electrode portion covers the sidewall of the first cathode auxiliary hole.

14. The display panel according to claim 12, wherein an end portion of a side of the connection portion away from the substrate is flush with the insulation layer.

15. The display panel according to claim 12, wherein the electron transport portion comprises a first sub-transport portion and a second sub-transport portion;

the first sub-transport portion is disposed circularly in the first cathode auxiliary hole;

the second sub-transport portion is disposed circularly in the second cathode auxiliary hole and is connected to the first sub-transport portion; and an orthographic projection of the connection portion on the substrate is within an orthographic projection of the electron transport portion on the substrate.

16. The display panel according to claim 12, wherein the electron transport portion covers the second cathode auxiliary hole.

17. The display panel according to claim 16, wherein the electron transport layer further comprises a third sub-transport portion disposed on a side of the pixel definition layer away from the substrate and connected to the electron transport portion.

18. The display panel according to claim 12, wherein the pixel definition layer further comprises a pixel definition portion disposed in the first cathode auxiliary hole and partially covering the connection portion.

19. The display panel according to claim 18, wherein an end portion of a side of the pixel definition portion away from the substrate is flush with an end portion of a side of the connection portion away from the substrate.

20. The display panel according to claim 19, wherein the end portion of the side of the pixel definition portion away from the substrate is flush with the insulation layer.

* * * * *